(12) United States Patent
Li et al.

(10) Patent No.: US 7,730,378 B2
(45) Date of Patent: Jun. 1, 2010

(54) LOW-COMPLEXITY HIGH-PERFORMANCE LOW-RATE COMMUNICATIONS CODES

(75) Inventors: Kai Li, New York, NY (US); Guosen Yue, Plainsboro, NJ (US); Xiaodong Wang, New York, NY (US); Mohammad Madihian, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 171 days.

(21) Appl. No.: 11/768,585

(22) Filed: Jun. 26, 2007

(65) Prior Publication Data

US 2008/0016426 A1    Jan. 17, 2008

Related U.S. Application Data

(60) Provisional application No. 60/806,152, filed on Jun. 29, 2006, provisional application No. 60/806,149, filed on Jun. 29, 2006.

(51) Int. Cl.
*H03M 13/00* (2006.01)

(52) U.S. Cl. .................................. 714/755; 714/781

(58) Field of Classification Search ................. 714/755, 714/794
See application file for complete search history.

(56) References Cited

U.S. PATENT DOCUMENTS

| | | | | |
|---|---|---|---|---|
| 3,896,416 A | * | 7/1975 | Barrett et al. ................ 714/774 |
| 5,581,481 A | * | 12/1996 | Weerackody et al. .......... 341/50 |
| 5,745,505 A | * | 4/1998 | Yonemitsu et al. .......... 714/755 |
| 5,757,282 A | * | 5/1998 | Lotter ................... 340/870.05 |
| 5,784,293 A | * | 7/1998 | Lipa ........................... 708/410 |
| 5,926,488 A | * | 7/1999 | Khayrallah .................. 714/752 |
| 6,377,610 B1 | * | 4/2002 | Hagenauer et al. .......... 375/136 |
| 7,215,645 B2 | * | 5/2007 | Nitsch et al. ................. 370/252 |
| 7,249,307 B2 | * | 7/2007 | Varshney et al. ............. 714/758 |
| 2006/0015789 A1 | * | 1/2006 | Shin et al. .................... 714/746 |
| 2006/0107161 A1 | * | 5/2006 | Varshney et al. ............. 714/746 |
| 2006/0179401 A1 | * | 8/2006 | Nefedov ...................... 714/800 |
| 2007/0067696 A1 | * | 3/2007 | Bhatt et al. .................. 714/758 |

FOREIGN PATENT DOCUMENTS

EP    1432129 A2  *  6/2004

OTHER PUBLICATIONS

Li Ping; Xiaoling Huang; Nam Phamdo; Zigzag codes and concatenated zigzag codes; IEEE Transactions on Information Theory, vol. 47, Issue 2, Feb. 2001 pp. 800-807.*

Nefedov, N.; Evaluation of low complexity concatenated codes for high data rate transmission; 14th IEEE Proceedings on Personal, Indoor and Mobile Radio Communications; vol. 2, Sep. 7-10, 2003 pp. 1868-1872.*

Li Ping; Leung, W.K.; Wu, K.Y.; Low-rate turbo-Hadamard codes; IEEE Transactions on Information Theory, vol. 49, Issue 12, Dec. 2003 pp. 3213-3224.*

* cited by examiner

*Primary Examiner*—Joseph D Torres
(74) *Attorney, Agent, or Firm*—Joseph J. Kolodka; James Bitetto

(57) ABSTRACT

An encoder includes an outer repetition encoder, an interleaver for permuting encoding from said outer repetition encoder; and an inner encoder for encoding information from the interleaver to provide a repeat zigzag-Hadamard code. In an exemplary embodiment, a common bit of a zigzag-Hadamard segment of encoding from said inner encoder is a repetition of a last parity bit of a previous zigzag-Hadamard segment of encoding from said inner encoder and said common bit is punctured.

6 Claims, 8 Drawing Sheets

LOW-COMPLEXITY HIGH-PERFORMANCE LOW-RATE COMMUNICATIONS CODES

This application claims the benefit of U.S. Provisional Application No. 60/806,152, entitled "Code Design Methods for Repeat-Zigzag Hadamard Codes", filed on Jun. 29, 2006, and U.S. Provisional Application No. 60/806,149, entitled "Low-Complexity High-performance Low-Rate-Code", filed on Jun. 29, 2006, the contents of both which are incorporated by reference herein.

BACKGROUND OF THE INVENTION

The present invention relates generally to coding techniques for communications and, more particularly, to a low-complexity high-performance low-rate communications code.

Low-rate codes play a critical role for communication systems operating in the low signal-to-noise ratio (SNR) regime (e.g., code-spread communication systems and power-limited sensor networks). The ultimate Shannon capacity of an additive white Gaussian noise (AWGN) channel in terms of signal-to-noise ratio (SNR) per information bit is about −1.6 dB for codes with rates approaching zero. Hadamard codes and super-orthogonal convolutional codes are traditional low-rate channel coding schemes which offer low coding gain and hence their performance is far away from the Shannon limit. As shown by the block diagram 10B of FIG. 1B, Turbo Hadamard codes are parallel concatenated codes and the component codes are convolutional-Hadamard codes $11B_1$, $11B_2$ and $11B_M$. Normally, the number of the states of the convolutional-Hadamard codes is larger than 2

The repeat-accumulate (RA) codes have proved to achieve the Shannon limit in AWGN channels when the coding rate approaches zero. As shown by the block diagram 10A in FIG. 1A of an RA code encoder with two channel outputs 13A, 14A, the outer code is a repetition code 11A interconnected by an interleaver 15A to the inner code 12A which is a rate-one accumulator. For a low density parity check (LDPC) code, the inner code is a single parity-check code. Note that in the low-rate regime, they will suffer large performance loss from the simulation, although they can approach capacity from the DE analysis and optimization. For instance, for LDPC code of rate 0.05, the simulated SNR threshold is larger than 0 dB which is far away from the capacity and much worse than RZH code with the same rate.

The repeat-accumulate (RA) codes and low-density parity-check (LDPC) codes have capacity-approaching capability for various code rates. However, in the low-rate region, both codes suffer from performance loss and extremely slow convergence speed with iterative decoding. Low-rate turbo-Hadamard codes offer good performance with faster convergence speed than RA codes and LDPC codes with the help of Hadamard code words. However, for turbo-Hadamard codes to perform well a relatively large Hadamard order is normally required which increases the complexity of the decoder. Accordingly, there is a need for low-rate code with a similar performance as a turbo-Hadamard code and with lower complexity.

SUMMARY OF THE INVENTION

In accordance with an aspect of the invention, an encoder includes an outer repetition encoder, an interleaver for permuting encoding from the outer repetition encoder, and an inner encoder for encoding information from the interleaver to provide a repeat zigzag-Hadamard code. In an exemplary embodiment of the encoder, a common bit of a zigzag-Hadamard segment of encoding from said inner encoder is a repetition of a last parity bit of a previous zigzag-Hadamard segment of encoding from said inner encoder and said common bit is punctured. In an alternative embodiment the outer repetition encoder comprises repetition codes with variable rates and the inner encoder responsive to variable rates provides irregular repeat zigzag-Hadamard code.

In accordance with another aspect of the invention, a method includes encoding information according to repetition encoding, permuting the encoding according to repetition encoding, and encoding information from the permuting to provide a repeat zigzag-Hadamard code. In an exemplary embodiment encoding information from the permuting includes puncturing a common bit of a zigzag-Hadamard segment of encoding that is a last parity bit of a previous zigzag-Hadamard segment of encoding. In an alternative embodiment, encoding information according to repetition encoding includes repetition codes with variable rates to influence the encoding information from the permuting to provide irregular repeat zigzag-Hadamard codes.

In accordance with a further aspect of the invention, an encoder includes an outer repetition encoder for encoding an information bit block having a given length with a given rate into a codeword having a code length, an interleaver for permuting the codeword from the outer encoder, and an inner recursive systematic zigzag-Hadamard encoder for encoding the permuted codeword. In an exemplary embodiment, the inner encoder is a punctured zigzag-Hadamard encoder in that a common bit of an encoded segment from the inner encoder is a repetition of a last parity bit of a previous encoded segment of the inner encoder and is punctured. In an alternative embodiment, the outer repetition encoder includes repetition codes with variable rates and the inner encoder provides irregular zigzag-Hadamard code.

In accordance with a yet another aspect of the invention, a decoder includes input for receiving information encoded by an outer repetition encoder, an interleaver for permuting encoding from the outer repetition encoder and an inner encoder for encoding information from the interleaver to provide a repeat zigzag-Hadamard code; an inner zigzag-Hadamard decoder for decoding parity bit information from the received information; and an outer repetition decoder for decoding outer information bits of the received information, decoding output from said inner zigzag-Hadamard decoder over a delay interleaver and feeding its output back through an interleaver to said inner zigzag-Hadamard decoder.

In accordance with yet a further aspect of the invention, a decoder includes input for receiving information encoded by an outer repetition encoder for encoding an information bit block having a given length with a given rate into a codeword having a code length, an interleaver for permuting the codeword from the outer encoder, and an inner recursive systematic zigzag-Hadamard encoder for encoding the permuted codeword; an inner zigzag-Hadamard decoder for decoding parity bit information from received information; and an outer repetition decoder for decoding outer information bits of the received information, decoding output from the inner zigzag-Hadamard decoder over a delay interleaver and feeding its output back through an interleaver to the inner zigzag-Hadamard decoder.

BRIEF DESCRIPTION OF DRAWINGS

These and other advantages of the invention will be apparent to those of ordinary skill in the art by reference to the following detailed description and the accompanying drawings.

DETAILED DESCRIPTION

The inventive code is a new class of low-rate error correction codes called repeat-zigzag-Hadamard (RZH) codes featuring simple encoder and decoder structures, and flexible coding rate. The inventive codes are essentially serially concatenated turbo-like codes where the outer code is a repetition code and the inner code is a punctured ZH code. Serial and parallel decoding schemes for RZH codes according to the invention are detailed. Irregular RZH codes according to the invention are also detailed and simulation results are provided. With its capacity approaching performance, simple encoding/decoding structure and flexibility in terms of parameter selection, the inventive RZH code is a viable low-rate coding candidate for systems operating in the low signal-to-noise-ratio SNR regime, e.g., the code-spread communication systems and the power-critical sensor networks.

I. Repeat-Zigzag-Hadamard Codes

1. Hadamard Codes and Zigzag-Hadamard Codes

A Hadamard codeword is obtained from a Hadamard matrix. Starting from $H_1=[+1]$, an n×n ($n=2^r$, where r is called the order of the Hadamard code) Hadamard matrix $H_n$ over $\{+1, -1\}$ can be constructed recursively as $$H_n = \begin{bmatrix} +H_{\frac{n}{2}} & +H_{\frac{n}{2}}(1) \\ +H_{\frac{n}{2}} & -H_{\frac{n}{2}}(2) \end{bmatrix}. \quad (3)$$

A length-$2^r$ Hadamard codeword set is formed by the columns of the bi-orthogonal Hadamard matrix $\pm H_n$, denoted by $\{\pm h^j : j=0,1,\ldots,2^r-1\}$, in a binary $\{0,1\}$ form, i.e., $+1 \rightarrow 0$ and $-1 \rightarrow 1$. Each Hadamard codeword carries (r+1) bits of information. In systematic encoding, the bit indexes $\{0,1,2,4,\ldots,2^{r-1}\}$ are used as information bit positions of the length-$2^r$ Hadamard code. The other ($2^r-r-1$) bits are parity bits. Denote H as a Hadamard encoder. Then the Hadamard encoding can be represented by $$c=H(d_0,d_1,\ldots,d_r) \quad (4)$$

where c is the resulting codeword. Clearly, c is a column of either $+H_n$ or $-H_n$. Hereafter, for simplicity, we will drop the subscript n in $H_n$.

Figure 1:
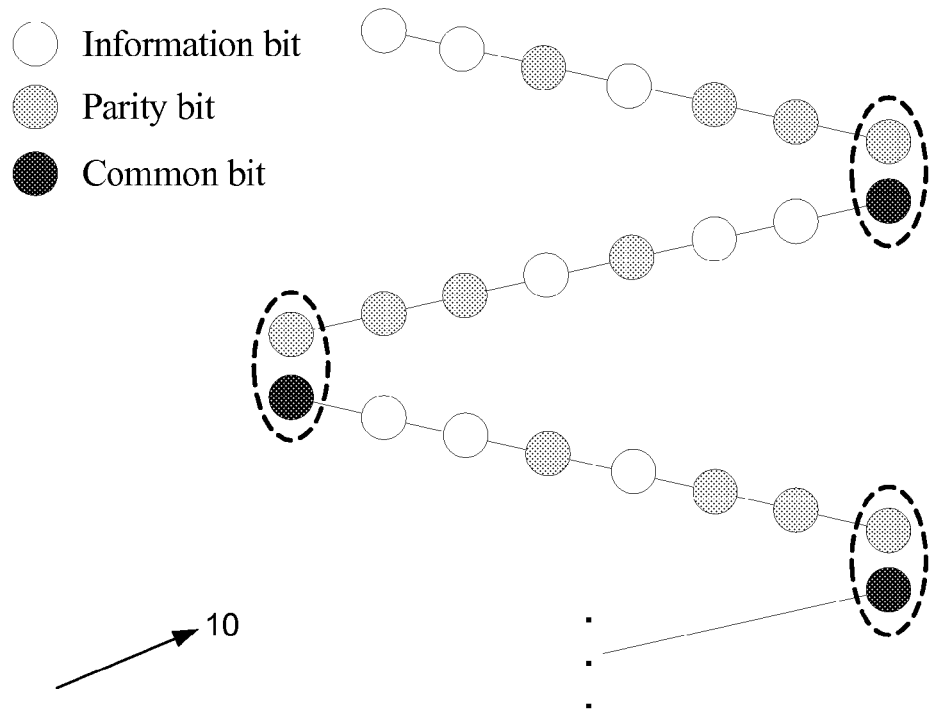
FIG. 1 is a graphical representation of an un-punctured systematic zigzag Hadamard ZH code with r=3 and the first bit of the first segment omitted.

As shown by the diagram 10 in FIG. 1, a zigzag-Hadamard code is described by a simple zigzag graph with each segment being a length-$2^r$ Hadamard code. The data stream d over $\{+1,-1\}$ is first segmented into blocks $\{d_j\}_j$, where $d_j=[d_{j,1}, d_{j,2}, \ldots, d_{j,r}]$, j=1,2,\ldots,J. Then as shown in FIG. 1, for a systematic ZH encoder, with the last parity bit of the previous coded Hadamard segment being the first input bit to the Hadamard encoder for the current segment, the coded bits of the j th segment are obtained by the Hadamard encoder with $$c_j=H(c_{j-1,2^r-1},d_{j,2},\ldots,d_{j,r}) \quad (5)$$

where the codeword $c_j=[c_{j,0},c_{j,1},\ldots,c_{j,2^r-1}]^T$, with $c_{j,0}=c_{j-1,2^r-1}$ being the common bit that connects the current segment to the previous segment and forms the zigzag structure, $c_{j,2^{i-1}}=d_{j,i}$, i=1,2,\ldots,r, being the systematic bits, and all other ($2^r-r-1$) bits being the parity bits. Denote $q_j=c_{j,0}$ and let $p_j$ represent the parity bits, i.e., $p_j=\{c_{j,i}, i\neq 0, i \neq 2^{r-1}, i=1,\ldots,r\}$. The j th coded bits segment is then denoted by a triplet, i.e., $c_j=\{d_j,q_j,p_j\}$, j=1,\ldots,J, and the overall ZH code sequence is denoted by $c=\{d,q,p\}$. Obviously, the above ZH code is a systematic code. Note that the common bit of the first segment can be freely assigned and is usually assumed to be −1.

ZH codes are convolutional-like codes, and we have the following results.

Definition 2.1. A binary convolutional-like code is said to be weight-recursive if any information sequence with Hamming distance one will produce a codeword with Hamming weight→∞ when its length→∞.

Theorem 2.1. A systematic ZH code with even Hadamard order r is weight-recursive, and a systematic ZH code with odd Hadamard order r is not weight-recursive. In what follows, only ZH codes with even Hadamard order are considered.

2. RZH Codes

Systematical RZH Encoder

Figure 2:
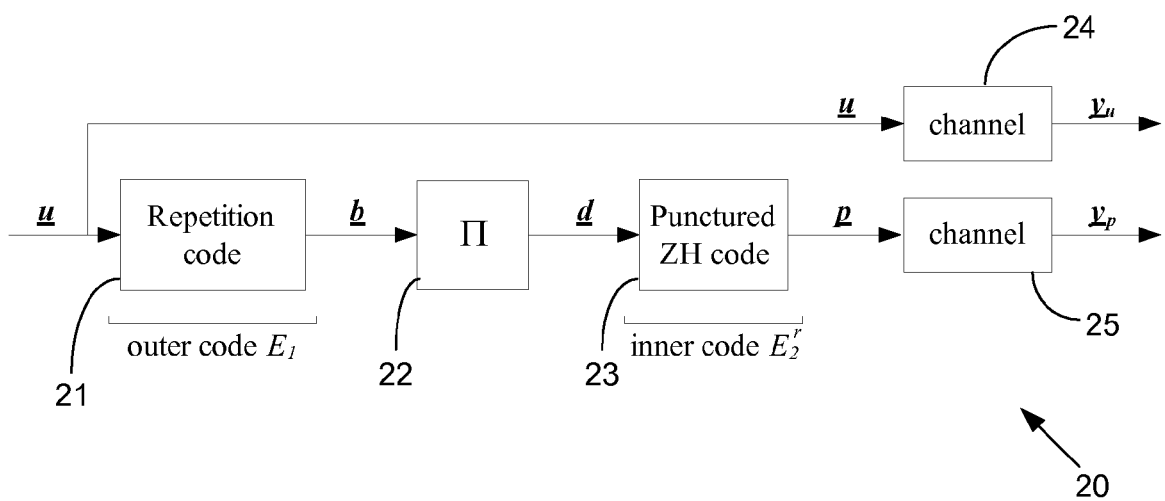
FIG. 2 is a block diagram of a systematical Repeat-zigzag-Hadamard RZH encoder.
Figure 1A:
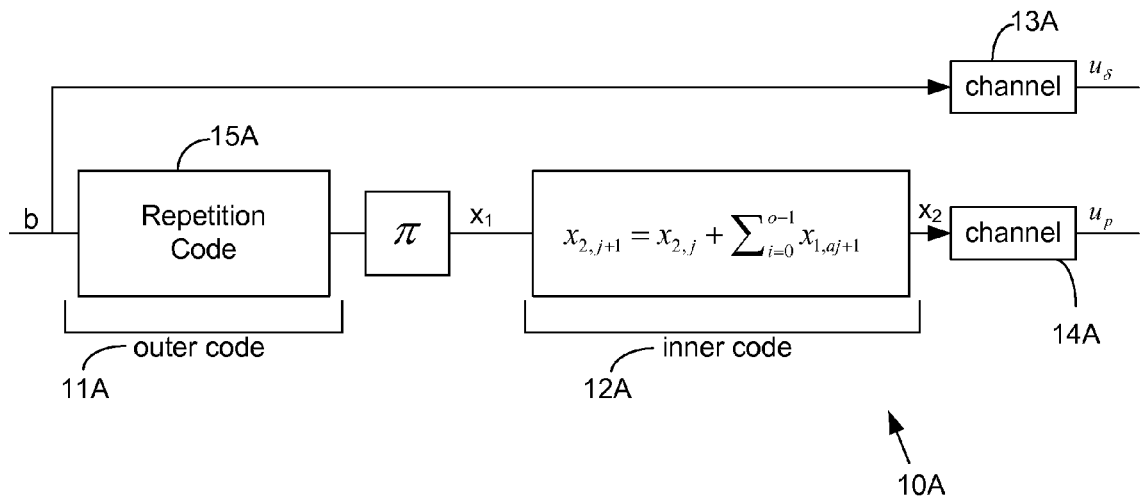
FIG. 1A (Prior Art) is a block diagram of a repeat accumulator encoder.
Figure 1B:
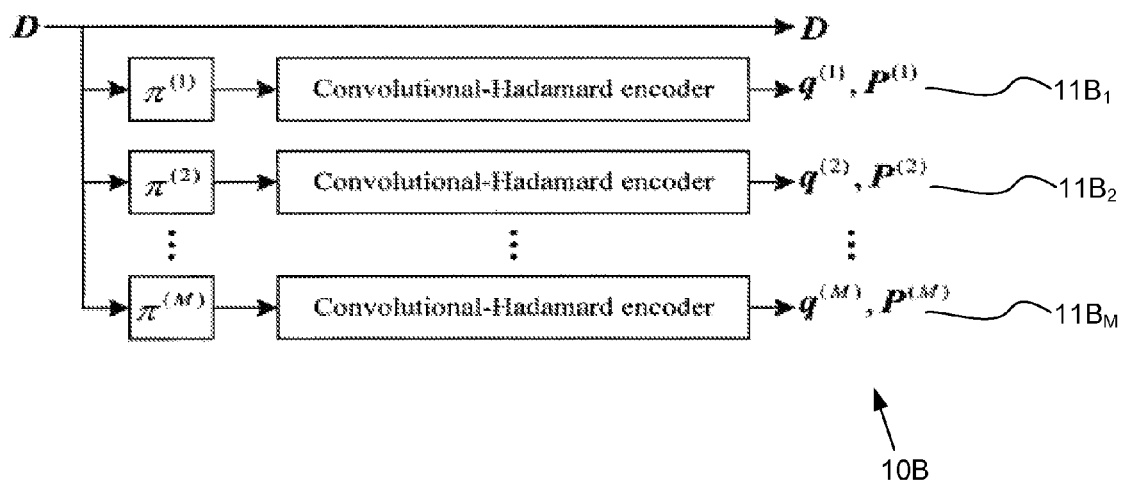
FIG. 1B (Prior Art) is a block diagram of a turbo Hadamard encoder.

The inventive code structure is an alternative to parallel concatenated zigzag-Hadamard codes and turbo-Hadamard codes, namely, the Repeat-zigzag-Hadamard (RZH) codes. The structure of a systematic RZH code is diagrammed in block form 20 in FIG. 2. An information bit block u of length k is encoded by an outer repetition encoder $E_1$, 21 of rate $1/d_v$ into a codeword b of length $N=kd_v$, which is permuted by an interleaver $\Pi$, 22 of length N to form d, and then encoded by an inner recursive systematic ZH encoder $E_2$, 23. The diagram shows an uncoded channel output 24 and encoded channel output 25. Since the outer code is a repetition code and the inner ZH code is a systematic code, we have $d_v$ repetitions in the resulting ZH codeword for every information bit. Since repetition codes have no coding gain, it is desirable to transmit the information bits only once. Also notice that the common bit of a ZH segment is a repetition of the last parity bit of the previous Hadamard segment and hence can also be punctured. After puncturing, the inner code is a punctured ZH code with which we obtain the systematical RZH code as shown in FIG. 2, with the parity bits p being the output of the punctured ZH code. Let n be the length of the ultimate codeword c={up}, then the overall code is an (n,k) linear block code and the overall coding rate is given by $$R_c = \frac{r}{d_v(2^r - r - 1) + r}, \quad (6)$$

where r is the order of the Hadamard code for the inner encoder. If the information bits u are also punctured, we obtain the nonsystematic RZH codes, and the coding rate is given by $$R_c = \frac{r}{d_v(2^r - r - 1)}. \quad (7)$$

Un-Punctured RZH Encoder

Figure 3:
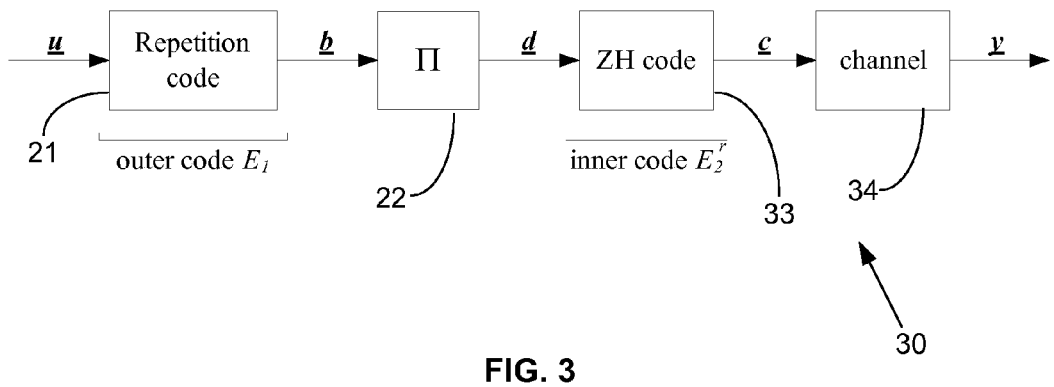
FIG. 3 is a block diagram of an un-punctured RZH encoder.

In case that the inner code has no puncturing, we have the un-punctured RZH codes whose structure 30 with a single output channel 34 is shown in FIG. 3. Although in general the un-punctured code cannot constitute a good structure since it contains an embedded repetition code, it is introduced here for the purpose of analysis. In fact, the performance of an un-punctured RZH code with a large Hadamard order can be very good when the coding rate is low. For the un-punctured code, the overall code rate is given by $R_c=R_1R_2$, where $R_1=1/d_v$ is the rate of the outer repetition code and $R_2$ is the rate of the inner ZH code 33. Since normally the first common bit of the ZH code is omitted, the overall rate of the un-punctured RZH code is given by $$R_c = \frac{k}{\left(\frac{kd_v}{r}\right)2^r - 1} = \frac{r}{d_v 2^r - r/k}. \quad (8)$$

With $k \to \infty$, we have $$R_c \to \frac{r}{d_v 2^r}.$$

Figure 4:
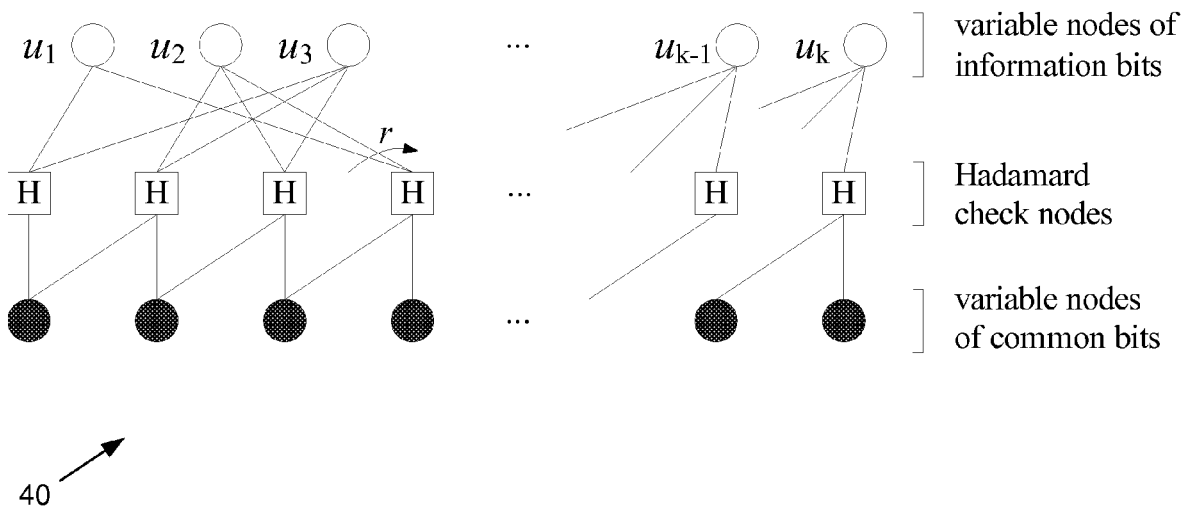
FIG. 4 is a tanner graph of an un-punctured (n,k) RZH code.

Similar to LDPC codes, we have irregular RZH codes (IRZH). For an (n,k) IRZH codes, the outer code consists of k repetition codes with variable rates. As shown in FIG. 4, suppose the rate of the i th repetition code is $1/d_v^{(i)}$, the degree of the i th variable node of information bit is $d_v^{(i)}$. Given the Hadamard code order r, an IRZH code is specified by the variable node degrees $d_v^{(i)}$, i=1, 2, . . . , k and the corresponding profile. Let D be the number of different variable node degrees, and denote these degrees by $d_{v,i}$, i=1,2, . . . ,D. Then the degree profile of a code can be specified by a polynomial $$f(x) = \sum_{i=1}^{D} a_i x^{d_{v,i}}$$

where $a_i \geq 0$ is the fraction of nodes having degree $d_{v,i}$. Note that $\{a_i\}$ must satisfy $\Sigma_i a_i = 1$. The average variable node degree is then given by $$\bar{d}_v = \sum_{i=1}^{D} a_i \cdot d_{v,i}. \quad (9)$$

Since for $$k \to \infty, R_c = \frac{r}{d_v 2^r},$$

we have $$\bar{d}_v = \frac{r}{R_c 2^r}. \quad (10)$$

Let $b_i$ be the fraction of edges incident to variable nodes of degree $d_{v,i}$. There are $(ka_i)d_{v,i}$ edges involved with such nodes, so we have $$b_i = \frac{ka_i d_{v,i}}{k\bar{d}_v} = \frac{d_{v,i}}{\bar{d}_v} \cdot a_i. \quad (11)$$

Note that $\{b_i\}$ must satisfy $\Sigma_i b_i = 1$. With proper degree profiles, IRZH codes can outperform regular RZH codes.

II. Efficient Decoding Algorithms

1. Low-Complexity APP Hadamard Decoding

Denote $x=[x_0, x_1, \ldots, x_{2^r-1}]^T$ as the received sequence of channel corrupted Hadamard codeword $c=[c_0, c_1, \ldots, c_{2^r-1}]^T$. The log-likelihood-ratios (LLRs) of the coded bits from the APP decoding over $\{+1, -1\}$ are given by $$L_H^{APP}(c_i) = \log \frac{P(c_i = +1 \mid x)}{P(c_i = -1 \mid x)} \quad (12)$$

$$= \log \frac{P(x \mid c_i = +1) P(c_i = +1)}{P(x \mid c_i = -1) P(c_i = -1)}$$

$$= \log \frac{\sum_{c \in \{\pm h^j\}: c_i = +1} P(x \mid c) P(c)}{\sum_{c \in \{\pm h^j\}: c_i = -1} P(x \mid c) P(c)}, i = 0, 1, 2, \cdots, 2^{r-1}.$$

Denote H(i, j) as the (i, j)-th entry of the Hadamard matrix H. Then for $c_i = +1$ we have $c = h^j$ with $H(i,j) = +1$ or $c = -h^j$ with $H(i,j)=-1$; similarly for $c_i=-1$. Assume that the coded bits are transmitted through an AWGN channel with noise variance $$\sigma^2 = \frac{N_0}{2}.$$

Given the $$\text{a priori LLR } L_H^E(c_i) = \log\frac{P(c_i = +1)}{P(c_i = -1)}$$

from the extrinsic channel, we obtain $$L_H^{APP}(c_i) = \log\frac{\sum_{h^j \in \{H:H(i,j)=\pm 1\}} \exp\left(-\frac{\|\pm h^j - x\|^2}{2\sigma^2}\right) P(c = \pm h^j)}{\sum_{h^j \in \{H:H(i,j)=\mp 1\}} \exp\left(-\frac{\|\pm h^j - x\|^2}{2\sigma^2}\right) P(c = \pm h^j)} \quad (13)$$

$$= \log\frac{\sum_{h^j \{H:H(i,j)=\pm 1\}} \gamma(\pm h^j)}{\sum_{h^j \{H:H(i,j)=\mp 1\}} \gamma(\pm h^j)}$$

with $$\gamma(\pm h^j) \triangleq \exp\left(\frac{1}{2}\left\langle\pm h^j, \frac{2x}{\sigma^2} + L_H^E(c)\right\rangle\right), \quad (14)$$

where $L_H^E(C)=[L_H^E(c_0), L_H^E(c_1), \ldots, L_H^E(c_{2^r-1})]^T$ and $(.,.)$ denotes the inner product. Direct calculation of (14) has a high computational complexity, i.e., $O(2^{2r})$. The fast Hadamard transform (FHT) can be employed to reduce the complexity of the inner product in (14) based on the butterfly graph of the Hadamard matrix.

To compute $y(j)=(h^j,x)$ for $j=0,1,\ldots,2^r-1$, we have $$y = H_n x = \begin{bmatrix} +I_{\frac{n}{2}} & +I_{\frac{n}{2}}(15) \\ +I_{\frac{n}{2}} & -I_{\frac{n}{2}}(16) \end{bmatrix} \begin{bmatrix} H_{\frac{n}{2}} x(17) \\ H_{\frac{n}{2}} x(18) \end{bmatrix}, \quad (19)$$

where $y=[y_0,\ldots,y_{r-1}]^T$, $H_n$ is the Hadamard matrix given in (3) with $n=2^r$, $I_{n/2}$ is an identity matrix, and $x$, $x$ are the first and the second halves of $x$. We can recursively factorize $H_{n/2} x$ and $H_{n/2} x$ in the same way until $\{H_1 x_j\}$ appears. This results in an r-stage recursive procedure for the evaluation of $H_n x$ and such a procedure is similar to that of the fast Fourier transform (FFT). With such an FHT method, the complexity for calculating (14) can be reduced to $O(r2^r)$ Similarly, the summations in the nominator and denominator in (13) for computing $L_H^{APP}(c_i), i=0,1,\ldots,2^r-1$, can be efficiently computed by the APP-FHT algorithm. In case that only the LLR values at information bits position $\{0,1,2,4,\ldots,2^{r-1}\}$ are needed, the decoding complexity of APP-FHT is $O(2^r)$.

To summarize, the low-complexity APP decoding of a length-$2^r$ Hadamard code consists of two steps: 1) compute (14) with the help of the FHT algorithm; 2) compute (13) with the help of the APP-FHT algorithm.

2. Belief Propagation Decoding of Un-punctured RZH Codes

Since the un-punctured RZH codes are standard serial concatenated codes, here we first introduce the decoding scheme for un-punctured codes, and the decoding of RZH codes as shown in FIG. 2 can be easily extended. An un-punctured RZH code can be represented by its Tanner graph 40, shown in FIG. 4. There are three sets of nodes in the Tanner graph of an un-punctured RZH code: the variable nodes of information bits, corresponding to u, the variable nodes of common bits, corresponding to q, and the Hadamard check nodes, corresponding to the Hadamard code constraints. Note that in FIG. 4, the parity bits of Hadamard codewords are embedded in their Hadamard check nodes. Those information bits that are repeated $d_v$ times are represented by information bit variable nodes with degree $d_v$, since they participate in $d_v$ Hadamard code constraints, and the common bit variable notes can be viewed as degree-2 information bit variable nodes. Each Hadamard check node is connected to r information bit nodes and to two common bit nodes. The connections between Hadamard check nodes and information bit nodes are determined by the edge interleaver and are highly randomized, whereas the connections between Hadamard check nodes and common bit nodes are arranged in a highly-structured zigzag pattern.

Based on the Tanner graph 40, iterative decoding algorithms can be derived. Here we consider two belief-propagation (BP) based decoding schemes for un-punctured RZH codes: the turbo-like serial decoding and the LDPC-like parallel decoding. In general, the serial decoding takes less iteration number than the parallel one, whereas the latter enjoys the advantage of easy hardware implementation with parallel processing. There is no fundamental difference in terms of bit error rate (BER) performance.

Turbo-like Decoding

Figure 5:
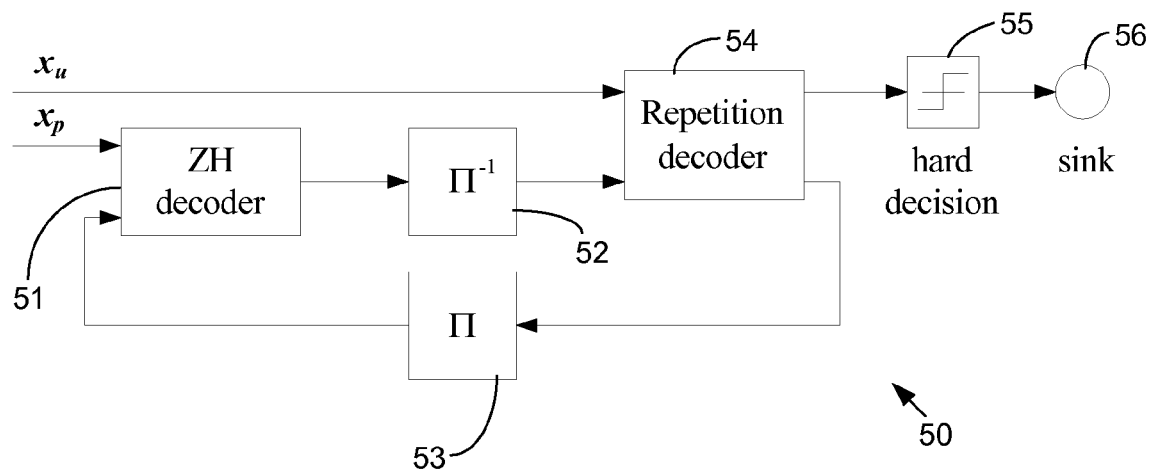
FIG. 5 is a block diagram of turbo-like decoding of un-punctured RZH codes.

As shown by the block diagram 50 in FIG. 5, since the un-punctured RZH codes are serially concatenated codes, the standard turbo-like decoding can be employed which consists of an inner ZH decoder 51 and an outer information bit node decoder (which is essentially a repetition decoder) 54, with extrinsic LLRs of d exchanged between the two decoders. The output from the ZH decoder is permuted by an interleaver delay $\Pi^{-1}$, 52 to the repetition decoder 54 which feeds back one output leg though an interleaver $\Pi$, 53 to the ZH decoder 51 and another output leg to the hard decision block 55 tied to a sink node 56. The encoding of a ZH code is a Markov process and similar to the decoding of zigzag codes, the a posteriori probability (APP) decoding of a ZH code can be accomplished with a two-way algorithm.

Two-way APP decoding algorithm of a ZH code is as follows:

[1] Preparation

Denote $c=[c_1, c_2, \ldots, c_J]$ as a ZH codeword with J Hadamard codeword segments. Let $\{x_j\}$ be the observation of $\{c_j\}$ from the communication channel, and $\{L_H^E(c_j)\}$ be the a priori LLRs of $\{c_j\}$ from the extrinsic channel.

[2] Forward recursion

Apply the APP Hadamard decoding to the first segment.

For $j=2,\ldots,J$, update the a priori LLR of the connection bit (the first bit) with the a posteriori LLR obtained from the APP decoding of the (j−1) th segment. Then apply the APP decoding to current segment as in (13).

[3] Backward recursion

Apply the APP Hadamard decoding to the J th segment.

For j=J−1, ..., 1, update the a priori LLR of its last bit with the a posteriori LLR obtained from the APP decoding of the (j+1) th segment. Then apply the APP decoding to current segment as in (13).

[4] Output

For j=1, 2, ... J, update the a priori LLRs of the first and last bits, respectively, with their a posteriori LLRs obtained from the forward and backward recursions. Then apply the APP decoding to this segment as in (13).

For RZH codes, only the extrinsic LLRs of d are exchanged between the inner ZH decoder and the outer repetition decoder. Note that for the code word c={$c_j$}$_j$, we have $c_{j,2^{i-1}}=d_{j,i}$, for i=1,2, ..., r and j=1,2, ..., J, hence we have $$L_H^E(c_{j,2^{i-1}}) = L_{zh}^{in}(d_{j,i}), \text{ for } i=1,2,\ldots r, \text{ and } j=1,2,\ldots J \quad (20)$$

where {$L_H^A(c_{j,2^{i-1}})$}$_{j,i}$ are the a priori LLRs for the Hadamard coded bits {$c_{j,2^{i-1}}$}$_{j,i}$, and {$L_{zh}^{in}(d_{j,i})$}$_{j,i}$ are the extrinsic LLRs of {$d_{j,i}$}$_{j,i}$ obtained from the outer repetition decoder in the previous iteration, initialized to zeros for the first iteration. After the two-way APP ZH decoding, we have the APP LLRs {$L_H^{APP}(c_{j,2^{i-1}})$}$_{j,i}$. Then the extrinsic information of d passing from the ZH decoder to the repetition decoder is given by $$L_{zh}^{out}(d_{j,i}) = L_H^{APP}(c_{j,2^{i-1}}) - L_{zh}^{in}(d_{j,i}), \text{ for } i=1,2,\ldots r, \text{ and } j=1,2,\ldots,J \quad (21)$$

which will be fed to the repetition decoder after de-interleaving.

Consider only a particular information bit node of degree $d_v$ which has $d_v$ incoming messages from the edge interleaver. The repetition decoder decodes by computing, for i=1,2, ..., $d_v$ $$L_{rep}^{out}(i) = \sum_{j \neq i} L_{rep}^{in}(j), \quad (22)$$

where $L_{rep}^{in}(j)$ is the j th a priori LLR value from the ZH decoder to the information bit node, and $L_{rep}^{out}(i)$ is the i th extrinsic LLR value coming out of the information bit node. The output extrinsic LLRs of the repetition decoder are then interleaved and fed to the ZH decoder as {$L_{zh}^{in}(d_{j,i})$}$_{j,i}$ after re-indexing.

LDPC-Like Decoding

For LDPC-like decoding, the common bit nodes are treated as degree-2 information bit nodes. In this case, all Hadamard check nodes and all information bit nodes are activated alternately and in parallel. Every time the Hadamard check nodes are activated, the J parallel Hadamard decoders firstly compute the APP LLRs of the information bits based on the channel observation {$x_j$}$_j$ and the a priori LLRs passed from the information nodes, with which the extrinsic LLRs of the information bits can be obtained by subtracting the a priori LLRs from the APP LLRs. The resulting extrinsic LLRs are then fed to the information bit nodes as the a priori information, with which the information bit nodes are activated parallelly and compute the extrinsic LLRs according to (22) for the next iteration.

3. Decoding of RZH Codes

Figure 6:
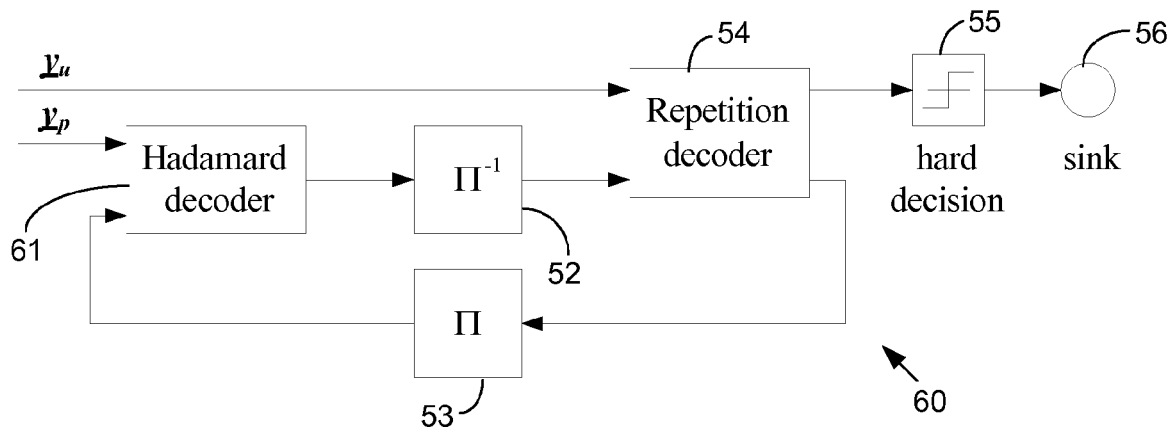
FIG. 6 is a block diagram of turbo-like decoding of systematic RZH codes.

The decoding of systematic RZH codes is similar to that of the un-punctured case except the inner decoder is a hadamard decoder 61. The only difference is the treatment of the channel observation for the information bits $x_u$. As shown in FIG. 2, the information bits are transmitted only once, then similar to the decoding of systematic RA codes, it is more convenient for $x_u$ to participate in the repetition decoding. The diagram 60 of FIG. 6 depicts the structure of the turbo-like decoder for systematic RZH codes. With such a structure, an information bit variable node of degree $d_v$ has $d_v+1$ incoming messages: $d_v$ from the edge interleaver and one from the communication channel. The repetition decoder 54 decodes by computing, for i=1,2, ..., $d_v$ $$L_{rep}^{out}(i) = L_{ch} + \sum_{j \neq i} L_{rep}^{in}(j), \quad (23)$$

where $L_{ch}$ is the LLR value about the information bit from the channel. For AWGN channel with noise variance $$\sigma^2 = \frac{N_0}{2},$$

we have $$L_{ch} = \frac{2x_u}{\sigma_2}$$

where $x_u$ is the channel observation of the binary phase shift keying (BPSK) modulated information bit u. Similar principle can be employed for LDPC-like decoding of systematic RZH codes.

For nonsystematic RZH codes, the information bits $x_u$ are not transmitted. Hence the information bit variable node of degree $d_v$ has only $d_v$ incoming messages from the edge interleaver which is similar to that of un-punctured RZH codes, and the repetition decoder decodes by computing, for i=1,2, ..., $d_v$, $L_{rep}^{out}(i) = \sum_{j \neq i} L_{rep}^{in}(j)$.

Note that for r=2, the nonsystematic RZH codes are essentially nonsystematic RA codes with a grouping factor of 2, which turn out to be useless due to the start failure of the iterative decoding algorithm. To see why this happens, consider the parity check code embedded in the RA code which produces parity bit p given the two inputs $d_1$ and $d_2$ according to $p = d_1 \oplus d_2$, where $\oplus$ denotes modulo-2 summation. For nonsystematic RA codes, no priori information about $d_1$ and $d_2$ is available at the beginning of the decoding. Also, it is clear that the map $p \to \{d_1, d_2\}$ is not injective. Consequently, $\{d_1, d_2\}$ cannot be correctly decoded even p is perfectly known which is the key factor that makes the iterative decoding algorithm fail to start. Such a problem does not exist for nonsystematic RZH codes with r≧4, since it is easy to show that the map $p \to d$ is injective for r≧4.

4. Upper Bound of Regular RZH Under Maximum Likelihood (ML) Decoding

Similar to regular LDPC codes and RA codes, the outer code of a regular RZH code is a single repetition code of rate $1/d_v$, with $d_v$ being a positive integer. The upper bound of regular RZH codes under maximum likelihood ML decoding is considered and compared it to that of the previously proposed PCZH codes. Consider a regular RZH code with $d_v$=M. For the block diagram 70 in FIG. 7, with an outer repetition encoder 71 and an uncoded channel block 74, let the length-kM interleaver be implemented by M parallel smaller interleavers of length k $72_1$ through $72_M$, and the inner code be a mixture of M punctured ZH codes $b73_1$ through $73_M$ tied to corresponding parallel channel blocks $74_1$ through $74_M$. We then obtain the PCZH codes. In this sense, PCZH codes can also be viewed as a specified implementation of the regular RZH codes. To obtain some insight on how the multiple parallel interleavers affect the code performance, we consider the ML bit error BER bounds of both regular RZH codes with single interleaver and PCZH codes with short frame size.

Assuming decoded by maximum likelihood ML criterion over a binary input additive weight Gaussian noise (BI-AWGN) channel, the simple ML bound is a tight upper bound on BER for an (n,k) linear block code with code rate $R_c=k/n$. Let $A_{w,h}$ being the number of codewords with input weight w and output weight h. The refined simple ML bound is given by $$P_b \le \sum_{h=h_{min}}^{h_{max}} \min\left\{ e^{-nE\left(\frac{E_s}{N_0},\frac{h}{n},\beta\right)}, \sum_{w=1}^{k} \frac{w}{k} A_{w,h} Q\left(\sqrt{2\frac{E_s}{N_0}h}\right) \right\}, \quad (24)$$

where $$E\left(\frac{E_s}{N_0},\frac{h}{n},\beta\right) \stackrel{\Delta}{=} \frac{1}{2}\ln\left(1-\beta+\beta e^{\frac{-2\ln\left(\sum_{w=1}^{k}\frac{w}{k}A_{w,h}\right)}{n}}\right) + \frac{\frac{\beta h}{n}}{1-\frac{(1-\beta)h}{n}}\frac{E_s}{N_0} \quad (25)$$

and $$\beta \stackrel{\Delta}{=} \frac{1-\frac{h}{n}}{\frac{h}{n}}\left[\sqrt{\frac{E_s}{N_0}\frac{\frac{2h}{n}}{1-\frac{h}{n}}-1+\left(1+\frac{E_s}{N_0}\right)^2} - \left(1+\frac{E_s}{N_0}\right)\right], \quad (26)$$

with $E_s/N_0=E_b/N_0 R_c$. The bound is valid for $0 \le \beta \le 1$, and for other $\beta$ value, we set $\beta=1$ which makes the simple ML bound reduce to the union bound.

Figure 8:
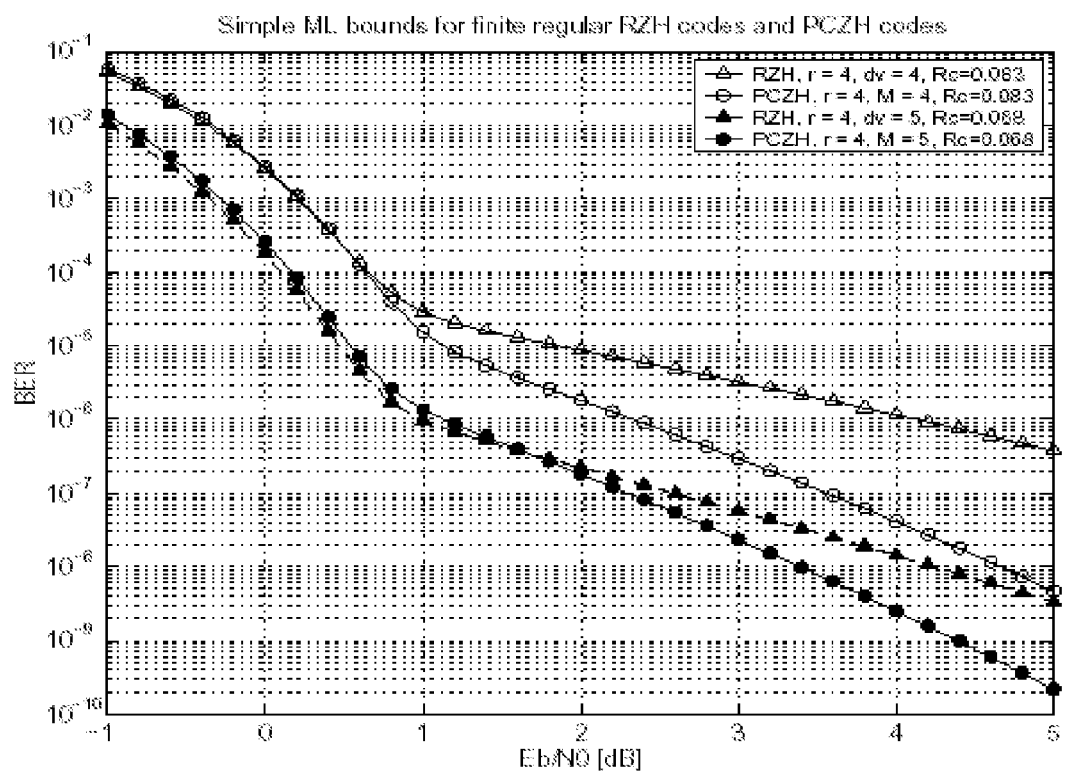
FIG. 8 is a graph of simple ML bounds for regular RZH codes and PCZH codes, with k=200.

The graph 80 of FIG. 8 shows the simple ML bounds for regular RZH codes and PCZH codes with r=4, k=200 and uniform interleavers. The computing of $A_{w,h}$ for the two codes is given in Appendix A. It is seen from FIG. 8 that, the average performance of PCZH codes exhibits a lower error-floor at the high SNR region and a slightly worse performance at the low SNR region than that of regular RZH codes with the same rate. This shows the effectiveness of the parallel implementation of regular RZH codes. Note that for regular RZH codes, the choice of possible coding rate is limited. For a more flexible coding rate, irregular RZH (IRZH) codes can be used where the outer code is a mixture of repetition codes with different rates. The optimization of IRZH codes will be considered in Section 4.

III. Code Performance

The following are numerical results for both un-punctured RZH codes and RZH codes in BIAWGN channel with serial and parallel decoding.

Code Performance with Serial Decoding

Figure 9:
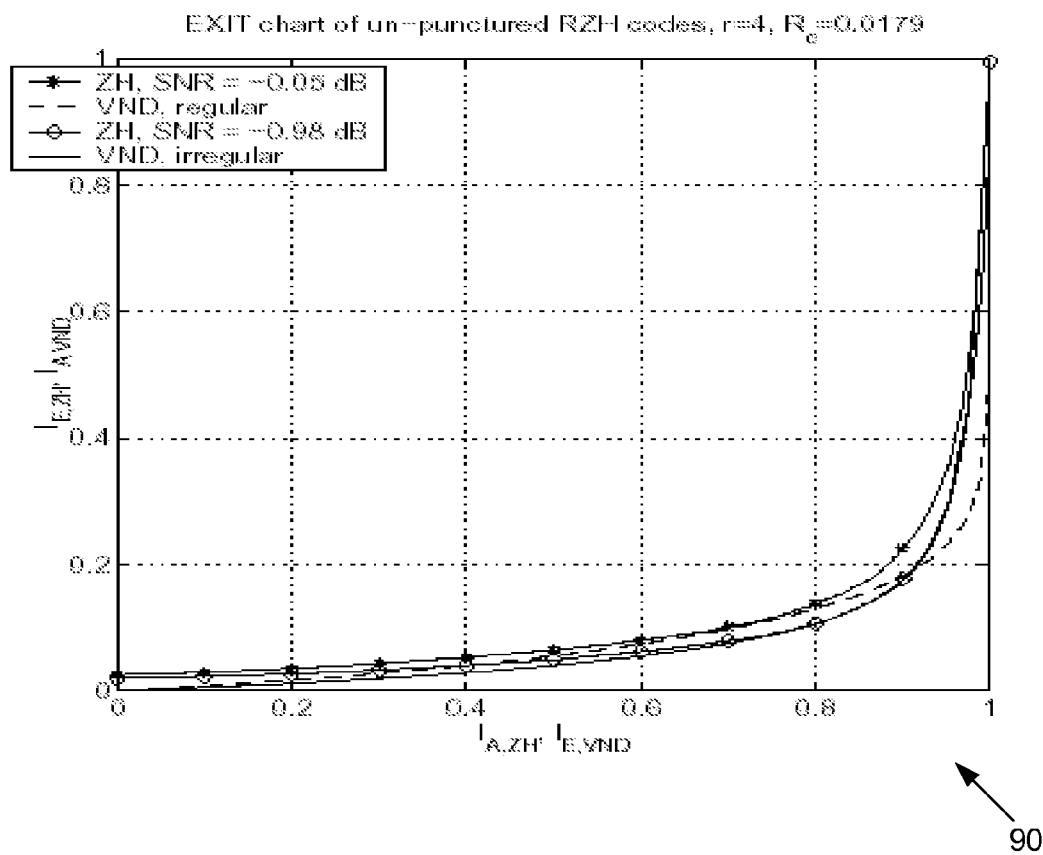
FIG. 9 is a graph of an EXIT chart of un-punctured RZH codes with r=4 and $R_C$=0.0179.

Example 1: Consider first an un-punctured regular RZH code with r=4 and $d_v=14$ which results in a coding rate of around 0.018. FIG. 9 plots 90 the EXIT chart of this code, from which it can be seen that the corresponding SNR threshold is around −0.05 dB. Now consider the irregular code with $\bar{d}_v=14$ whose degree profile polynomial is given by $f(x)=0.323x^3+0.175x^8+0.026x^{22}+0.476x^{23}$. The corresponding EXIT chart for $E_b/N_0=-0.98$ dB is also plotted in FIG. 9, where the solid line denotes the EXIT function of the outer mixture repetition codes with the optimized profile and diamond denotes the EXIT function of the inner ZH code.

Figure 10:
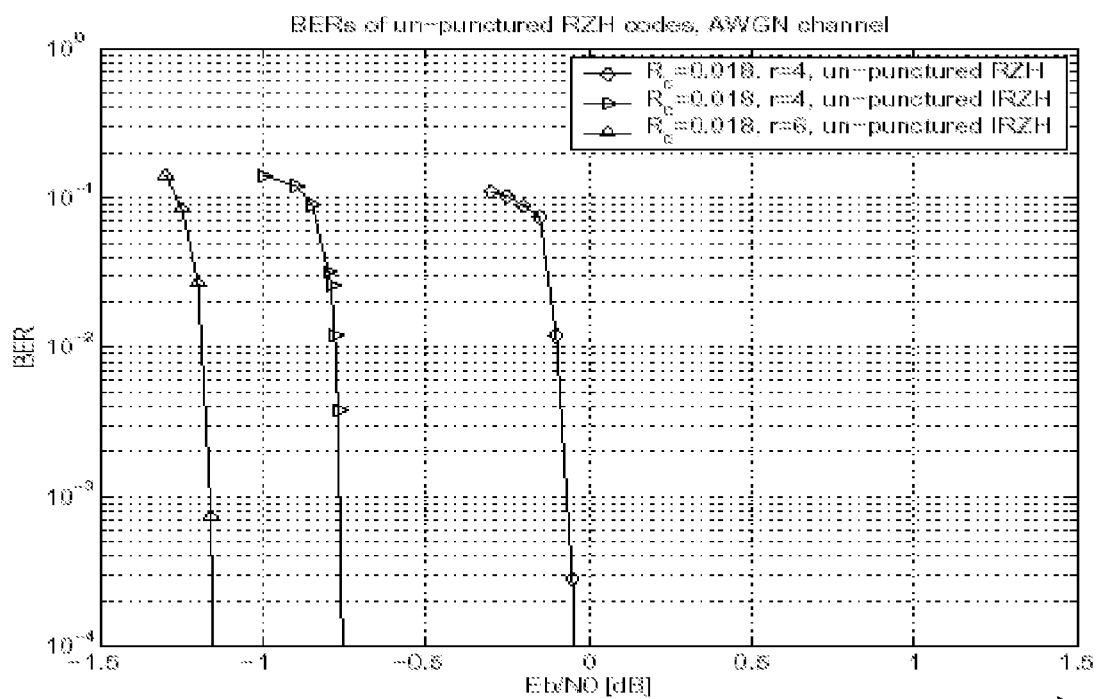
FIG. 10 is a graph of bite error rates BERs for un-punctured IRZH codes, with an information block length of 65536 and a maximum iteration number of 150.

FIG. 10 plots 100 the simulated BER results of the regular and irregular un-punctured RZH codes with an information block length of 65536 and a maximum iteration number of 150. It is seen that with r=4, the un-punctured IRZH code has a gain of 0.71 dB (measured at $P_b=10^{-4}$) over the regular code, whereas the gap to the capacity is around 0.8 dB. With larger r, better codes exist. For instance, for r=6, a code with $f(x)=0.363x^3+0.338x^6+0.299x^7$ has a simulated threshold (measured at $P_b=10^{-4}$) of −1.13 dB, which is only 0.41 dB away from the capacity.

Figure 11:
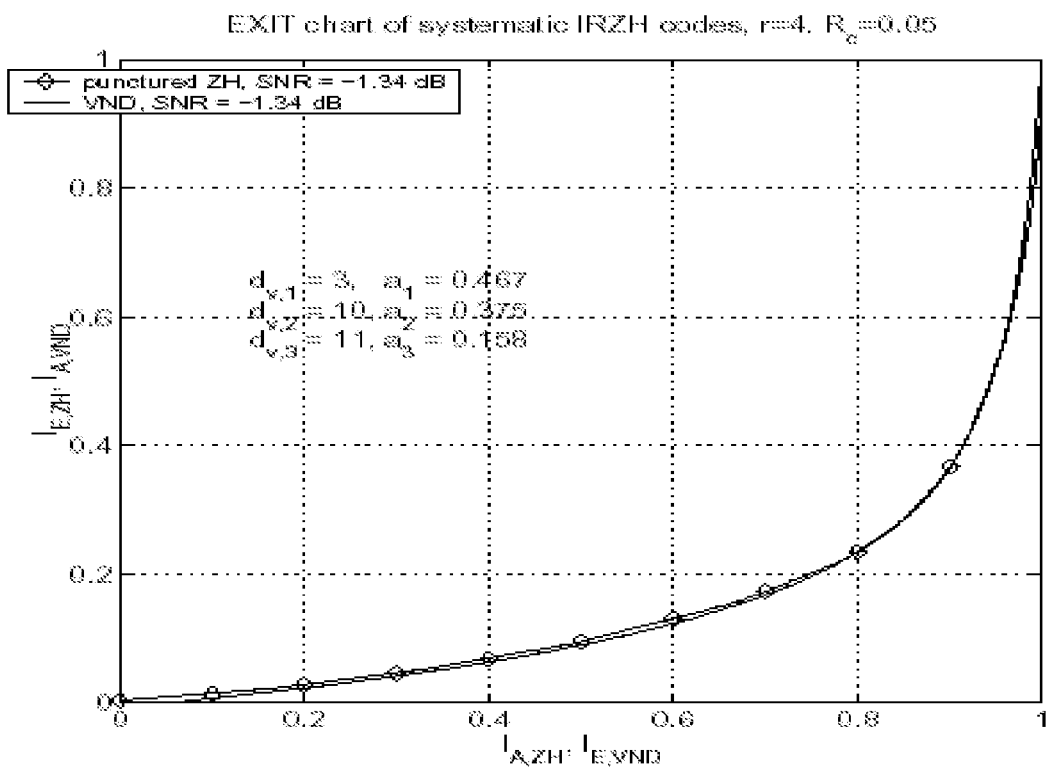
FIG. 11 is a graph of an EXIT chart of systematic IRZH codes with r=4 and $R_C$=0.05.
Figure 12:
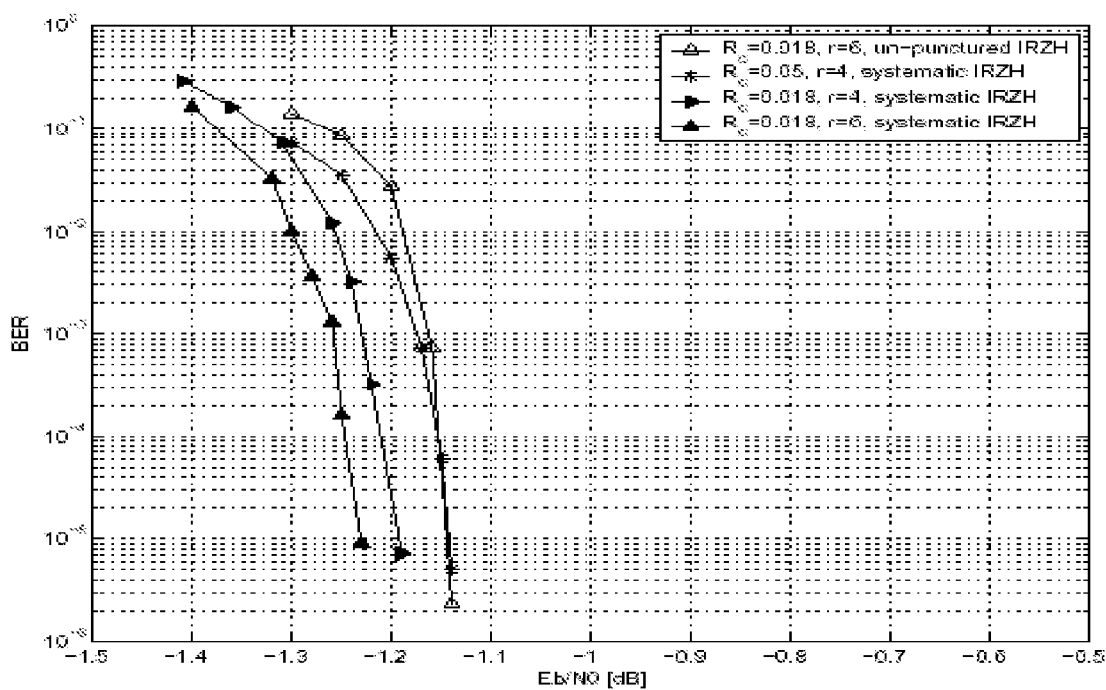
FIG. 12 is a graph of BERs for IRZH codes, with an information block length of 65536 and a maximum iteration number of 150.

Example 2: Next we consider the performance of the systematic IRZH codes. Since the repetition bits are punctured, much better performance can be expected. Indeed, for r=4 and $R_c=0.05$, a code with $f(x)=0.467x^3+0.375x^{10}+0.158x^{11}$ has a theoretic SNR threshold of $$\frac{E_b}{N_0} = -1.34 \text{ dB},$$

which is only 0.1 dB away from the capacity. The EXIT chart of the curve-fitting result is shown 110 in FIG. 11 and the BER performance is shown in FIG. 12. Results show that the simulated SNR threshold is −1.14 dB (only around 0.31 dB away from the capacity) which is much better than that of the un-punctured code with the same r and a much lower (0.0179) coding rate. FIG. 12 also depicts the BER performance of a lower rate code with r=4 and $R_c=0.018$ whose theoretical SNR threshold is $$\frac{E_b}{N_0} = -1.42 \text{ dB}$$

with $f(x)=0.364x^3+0.014x^{11}+0.192x^{12}+0.074x^{13}+0.095x^{36}+0.136x^{37}+0.1087x^{38}+0.004x^{39}+0.013x^{200}$. The simulated SNR threshold of this code is around −1.2 dB, which is 0.34 dB away from the capacity and around 0.8 dB better than the same rate un-punctured code with r=6. With r=6, a code with $f(x)=0.401x^3+0.573x^7+0.026x^{20}$ has a simulated SNR threshold of −1.24 dB, which is slightly better than that of r=4.

Example 3: To see the difference between the systematic and nonsystematic codes, for r=4 and $R_c=0.05$, a nonsystematic code with $f(x)=0.456x^3+0.147x^9+0.343x^{10}+0.054x^{20}$ has a theoretical SNR threshold of $$\frac{E_b}{N_0} = -1.43$$

dB, which is slightly better than that of systematic code. The BER performance of this code is shown 120 in FIG. 12 which shows a simulated SNR threshold of around −1.16 dB, with a small coding gain of 0.02 dB over its systematic counterpart. This is as expected since for nonsystematic IRZH codes, the systematic bits are further punctured and for the same rate, more parity bits can be transmitted.

Performance with Parallel Decoding

Figure 13:
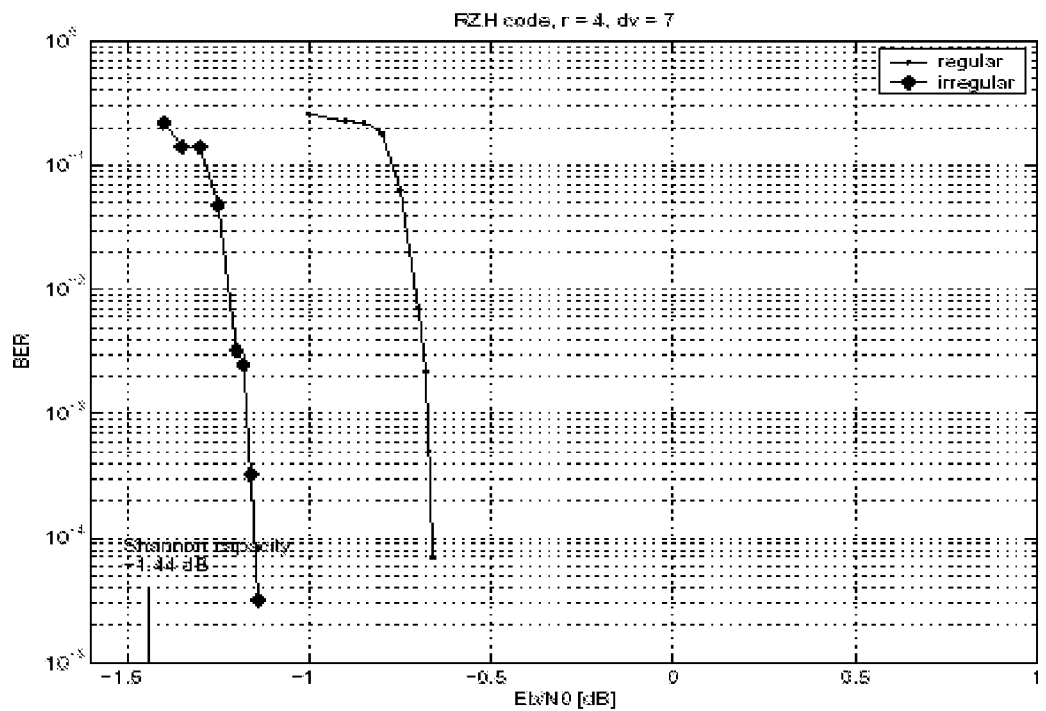
FIG. 13 is a graph of BER performance of irregular RZH codes over BIAWGN channel.

Example 4: We first consider the performance of the regular code. Consider a regular systematic RZH code with r=4 and $d_v=7$ which corresponds to a rate of 0.0494 . FIG. 13 depicts the simulated BER performance of this code. The simulated SNR threshold (measured at $P_b=10^{-4}$) is around −0.66 dB which is 0.78 dB away from the Shannon capacity −1.44 dB. To obtain better performance, we resort to irregular codes. We consider an irregular code with $\bar{d}_v=7$ and $f(x)=0.4353x^3+0.0072x^4+0.0016x^5+0.0099x^8+0.1759x^9+0.1829x^{10}+0.0800x^{11}+0.1071x^{12}$. The simulated SNR threshold for this code is −1.15 dB, which is only 0.29 dB away from the capacity and has a gain of 0.49 dB over the regular one. Next we provide another example.

Figure 14:
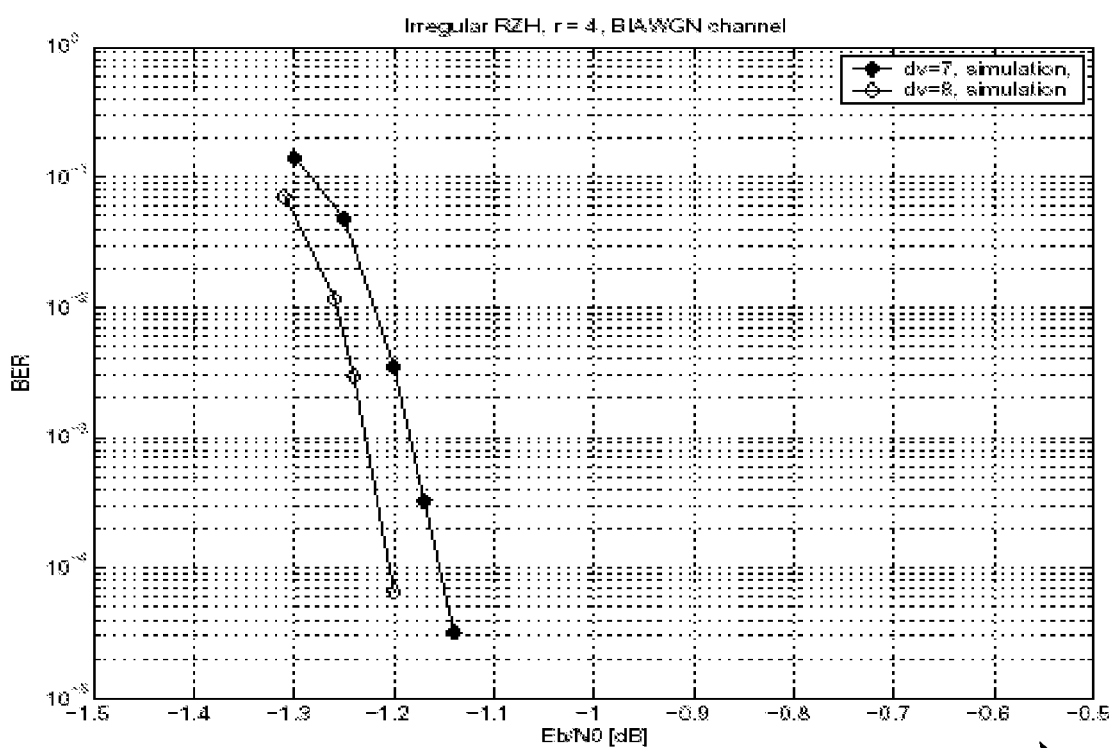
FIG. 14 is a graph of BER performance of irregular RZH codes over BIAWGN channel.

Example 5: By setting r=4 and $\bar{d}_v=8$, the systematic RZH code has a rate of 0.0435. The Shannon limit for this code is −1.46 dB. Again, consider an IRZH code with $f(x)=0.4044x^3+0.0026x^4+0.0048x^5+0.0245x^6+0.0453x^8+0.0669x^9+0.0296x^{10}+0.0203x^{11}+0.0985x^{12}+0.3030x^{13}$. The BER performance of this code is depicted in FIG. 14 with a simulated SNR threshold of −1.2 dB, which is only 0.26 dB away from the capacity and 0.4 dB away from the ultimate Shannon limit.

IV. Conclusion

To summarize, the inventive repeat zigzag-Hadamard (RZH) codes are serially concatenated turbo-like codes where the outer code is a repetition code and the inner code is a punctured zigzag-Hadamard code. The inventive code has the following desirable features due to its specific structure. The present RZH codes are based on ZH code which has a simple structure and can significantly reduce the encoding complexity at the transmitter end. The RZH codes utilize Hadamard codewords, a fact that enables faster decoding convergence and better coding gain over LDPC codes and RA codes in the low-rate region. The RZH codes are graph-based codes; hence low-complexity message-passing decoding algorithms can be employed at the receiver end. For serial decoding, since the inner ZH code is based on a two-state Markov process, the decoding complexity is low. For parallel decoding, the inner code is a Hadamard code, and fast decoding scheme exists for Hadamard codes; also, parallel structure is desirable in hardware implementation, which makes faster operation possible. The outer codes are repetition codes and by having different rate repetition codes one can have irregular RZH codes (IRZH). With proper a degree profile, the IRZH codes exhibit significant coding gain over regular RZH codes and turbo-Hadamard codes.

VI. Appendix: Input-Output Weight Enumerators for RZH Codes and PCZH Codes

In this Appendix, we introduce the calculation of input-output weight enumerator function (IOWEF) for RZH codes and PCZH codes with finite length. Consider an (n,k) block code constructed from a terminated ZH code with direct truncation. Then the IOWEF of this code is $$A^{[zh]}(W, H) = \sum_{w=0}^{k} \sum_{h=0}^{n} A_{w,h}^{[zh]} W^w H^h \quad (27)$$

A ZH code can be represented by a two-state diagram. Consider a punctured ZH code with r=4 (here, both information bits and common bits are punctured). The state-transition matrix for this code is $$C(W, H) = \begin{bmatrix} 1+6W^2H^6+W^4H^4 & 4WH^7+4W^3H^5(28) \\ 4WH^6+4W^3H^4 & H^7+6W^2H^5+W^4H^{11}(29) \end{bmatrix} \quad (30)$$

and the IOWEF is $$A^{[zh]}(W, H) = [1 \quad 0] C^J(W, H) \begin{bmatrix} 1(31) \\ 1(32) \end{bmatrix}, \quad (33)$$

where J=k/r is the total number of Hadamard segments.

For an (n,k) regular systematic RZH code with the coding rate of the outer code being $1/d_v$, based on the uniform interleaver assumption [?], the IOWE is given by $$A_{w,k} = \sum_{d=0}^{N} \frac{\binom{k(34)}{w} A_{d,h-w}^{[zh]}}{\binom{N(35)}{wd_v}} \quad (36)$$

where $N=kd_v$ and $A_{d,h-w}^{[zh]}$ is the IOWE of the ZH code which can be calculated by (27) and (33).

For an (n,k) code, the conditional weight enumerating function (CWEF) is defined as $$A_w(H) \overset{\Delta}{=} \sum_{h=0}^{n} A_{w,h} H^h, w = 0, \cdots, k. \quad (37)$$

Figure 7:
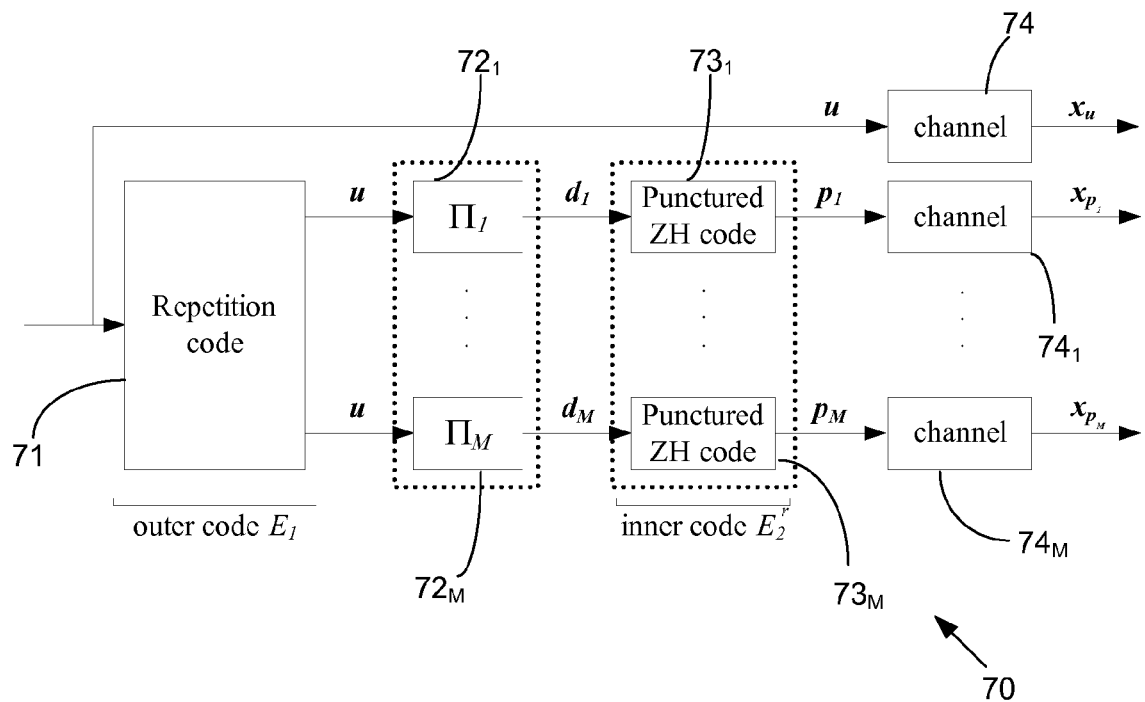
FIG. 7 is a block diagram of parallel implementation of systematic RZH code-parallel concatenated zigzag Hadamard (PCZH) code.

Then based on the uniform interleaver assumption, the CWEF of the PCZH code is given by $$A_w(H) = \frac{[A_w^{[zh]}(H)]^M H^w}{\binom{k(38)}{w}^{M-1}}, w = 0, \cdots, k \quad (39)$$

where $A_w^{[zh]}(H)$ is the CWEF of the punctured ZH code and M is the number of parallel components as shown in FIG. 7. With $\{A_{w,h}\}_{w,h}$, the simple ML bound can be obtained by (24).

The present invention has been shown and described in what are considered to be the most practical and preferred embodiments. That departures may be made there from and that obvious modifications will be implemented by those skilled in the art. It will be appreciated that those skilled in the art will be able to devise numerous arrangements and variations which, not explicitly shown or described herein, embody the principles of the invention and are within their spirit and scope.

What is claimed is:

1. An encoder apparatus comprising:
   an outer repetition encoder for encoding a signal with a mixture of repetition codes with different rates,
   an interleaver for permuting encoding from said outer repetition encoder; and an inner encoder for encoding information from the interleaver to provide a an irregular-repeat zigzag-Hadamard code.

2. The encoder apparatus of claim 1, wherein a common bit of a zigzag-Hadamard segment of encoding from said inner encoder is a repetition of a last parity bit of a previous zigzag-Hadamard segment of encoding from said inner encoder and said common bit is punctured.

3. The encoder apparatus of claim 1, wherein a coding rate for said encoder comprise $$R_c = \frac{r}{d_v(2^r - r - 1) + r},$$

where r is the order of a Hadamard code for said inner encoder and $d_v$ are repetitions in resulting codewords from said inner encoder for every information bit.

4. The encoder apparatus of claim 1, wherein a coding rate for said encoder comprises $$R_c = \frac{r}{d_v(2^r - r - 1) + r},$$

where r is the order of a Hadamard code for said inner encoder, $d_v$ are repetitions in resulting codewords from said inner encoder for every information bit and bits from said information are punctured.

5. The encoder apparatus of claim 1, wherein said inner encoder comprises un-punctured coding to provide an un-punctured irregular-repeat zigzag-Hadamard code.

6. The encoder apparatus of claim 1, wherein the inner encoder uses a zig-zag Hadamard code that is based on a two-state Markov process.

* * * * *